United States Patent
Leenders et al.

(10) Patent No.: US 8,953,141 B2
(45) Date of Patent: Feb. 10, 2015

(54) IMMERSION LITHOGRAPHIC APPARATUS AND DEVICE MANUFACTURING METHOD WITH ASYMMETRIC ACCELERATION PROFILE OF SUBSTRATE TABLE TO MAINTAIN MENISCUS OF IMMERSION LIQUID

(75) Inventors: Martinus Hendrikus Antonius Leenders, Rhoon (NL); Sjoerd Nicolaas Lambertus Donders, Vught (NL); Christian Wagner, Eersel (NL); Rogier Hendrikus Magdalena Cortie, Ittervoort (NL)

(73) Assignee: ASML Netherlands B.V., Veldhoven (NL)

( * ) Notice: Subject to any disclaimer, the term of this patent is extended or adjusted under 35 U.S.C. 154(b) by 1260 days.

(21) Appl. No.: 12/329,145

(22) Filed: Dec. 5, 2008

(65) Prior Publication Data

US 2009/0161089 A1      Jun. 25, 2009

Related U.S. Application Data

(60) Provisional application No. 61/008,589, filed on Dec. 21, 2007.

(51) Int. Cl.
  G03B 27/52   (2006.01)
  G03F 7/20    (2006.01)

(52) U.S. Cl.
  CPC ........ *G03F 7/70725* (2013.01); *G03F 7/70341* (2013.01)
  USPC ............................................................ 355/30

(58) Field of Classification Search
  USPC ........................................ 355/30, 72–74, 53
  See application file for complete search history.

(56) References Cited

U.S. PATENT DOCUMENTS

| | | | |
|---|---|---|---|
| 4,509,852 A | 4/1985 | Tabarelli et al. | |
| 7,016,019 B2 | 3/2006 | Van Den Biggelaar et al. | |
| 7,068,350 B2 * | 6/2006 | Nishi et al. | 355/53 |
| 7,081,943 B2 * | 7/2006 | Lof et al. | 355/30 |

(Continued)

FOREIGN PATENT DOCUMENTS

| | | |
|---|---|---|
| EP | 1420300 A2 | 5/2004 |
| EP | 1482372 A1 | 12/2004 |

(Continued)

OTHER PUBLICATIONS

Australian Patent Office Search Report in related application SG 200809216-5 mailed May 5, 2009.

(Continued)

*Primary Examiner* — Chia-how Michael Liu
(74) *Attorney, Agent, or Firm* — Pillsbury Winthrop Shaw Pittman LLP (57) ABSTRACT

A lithographic apparatus includes a liquid supply system configured to supply an immersion liquid between a downstream optical element of a projection system of the lithographic apparatus and the substrate, and a control system which is arranged to drive the substrate table so as to perform an acceleration profile to accelerate the substrate table from a first velocity in a first direction to a second velocity in a second direction. The acceleration profile is asymmetric in time and is dimensioned so that when the substrate table is accelerated according to the acceleration profile, a force to break a meniscus of the immersion liquid remains lower than a force to maintain the meniscus of the immersion liquid.

20 Claims, 4 Drawing Sheets

(56) References Cited

U.S. PATENT DOCUMENTS

| | | |
|---|---|---|
| 7,804,574 B2 | 9/2010 | Streefkerk et al. |
| 2006/0028630 A1* | 2/2006 | Akimoto .......................... 355/53 |
| 2007/0081133 A1 | 4/2007 | Kayama et al. |
| 2008/0297749 A1 | 12/2008 | Wirtz |

FOREIGN PATENT DOCUMENTS

| | | |
|---|---|---|
| JP | 2004-363588 A | 12/2004 |
| JP | 2005-183966 A | 7/2005 |
| JP | 2006-049644 A | 2/2006 |
| JP | 2007-201384 | 8/2007 |
| TW | 200426521 | 12/2004 |
| TW | 200618060 | 6/2006 |
| WO | 99/49504 A1 | 9/1999 |
| WO | 2006-007111 A | 1/2006 |
| WO | 2006130338 A1 | 12/2006 |

OTHER PUBLICATIONS

Office Action in related Korean patent application No. 10-2008-0130149 dated Dec. 9, 2010.

Office Action in related Japanese application No. 2008-317800 mailed May 6, 2011.

Taiwan Office Action dated Nov. 23, 2012 in corresponding Taiwan Patent Application No. 097148044.

* cited by examiner

Prior Art

Fig. 3

Prior Art

Fig. 4

Prior Art

Fig. 5

Prior Art

Fig. 6A                    Fig. 6B

IMMERSION LITHOGRAPHIC APPARATUS AND DEVICE MANUFACTURING METHOD WITH ASYMMETRIC ACCELERATION PROFILE OF SUBSTRATE TABLE TO MAINTAIN MENISCUS OF IMMERSION LIQUID

CROSS-REFERENCE TO RELATED APPLICATIONS

This application claims priority and benefit under 35 U.S.C. §19(e) to U.S. Provisional Patent Application No. 61/008,589, entitled "Immersion Lithographic Apparatus and Device Manufacturing Method", filed on Dec. 21, 2007. The content of that application is incorporated herein in its entirety by reference.

FIELD

The present invention relates to a lithographic apparatus, to a lithographic projection method and to a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that should be accelerated during a scanning exposure. This may require additional or more powerful motors, and turbulence in the liquid may lead to undesirable and unpredictable effects.

Figure 2:
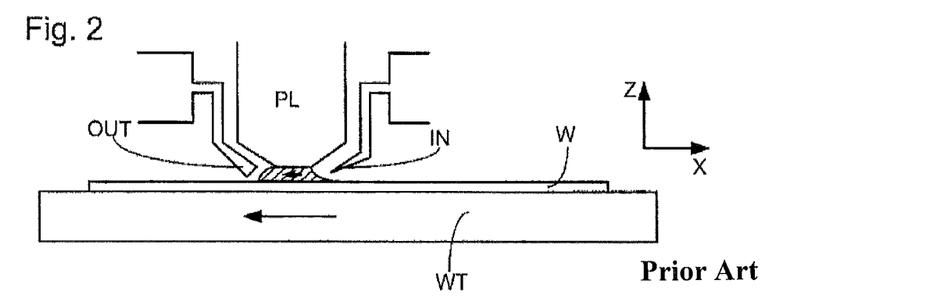
FIGS. 2 and 3 depict a liquid supply system used in a prior art lithographic projection apparatus.
Figure 3:
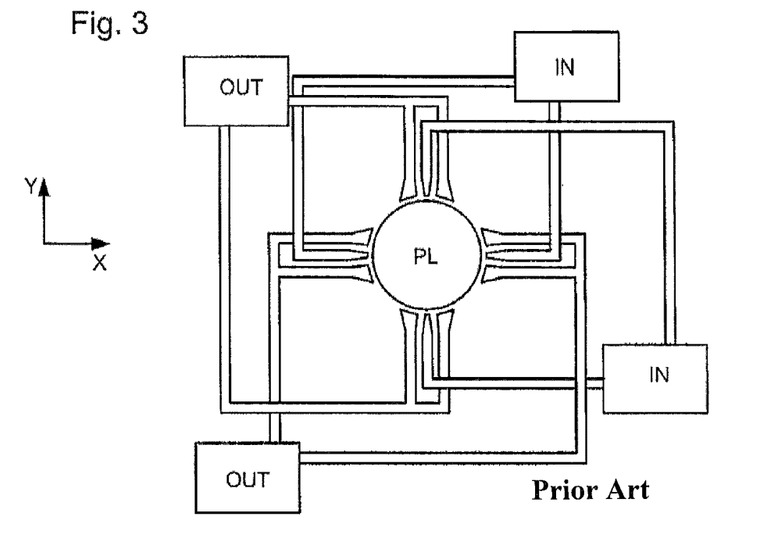

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in International Patent Application Publication No. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Figure 4:
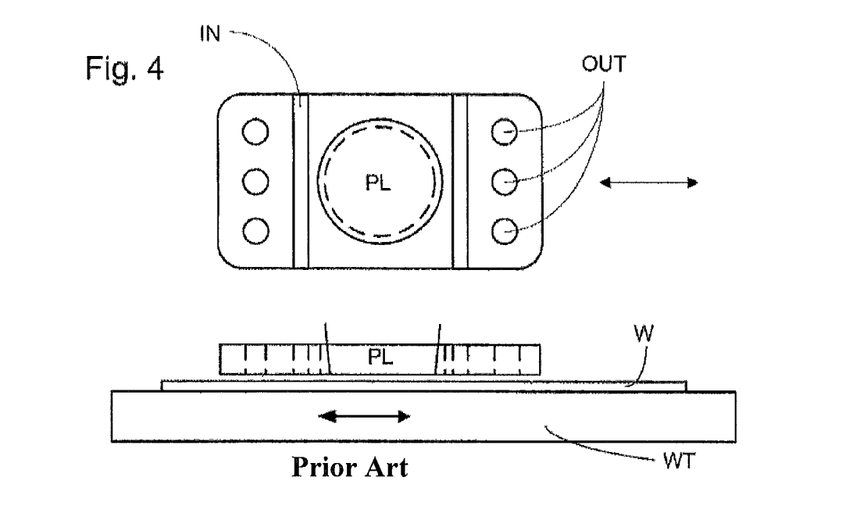
FIG. 4 depicts a liquid supply system according to another prior art lithographic projection apparatus.

Another solution which has been proposed is to provide the liquid supply system with a seal member which extends along at least a part of a boundary of the space between the final element of the projection system and the substrate table. Such a solution is illustrated in FIG. 4. The seal member is substantially stationary relative to the projection system in the XY plane though there may be some relative movement in the Z direction (in the direction of die optical axis). A seal is formed between the seal member and the surface of the substrate. Preferably the seal is a contactless seal such as a gas seal. Such as system with a gas seal is disclosed in European Patent Application No. 03252955.4 hereby incorporated in its entirety by reference.

Figure 5:
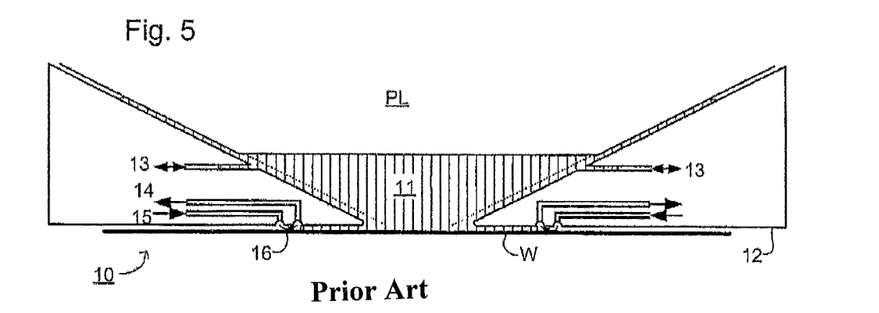
FIG. 5 depicts a liquid supply system according to another prior art lithographic projection apparatus.

Another arrangement is shown in FIG. 5. A reservoir 10 forms a contactless seal to the substrate around the image field of the projection system so that liquid is confined to fill a space between the substrate surface and the final element of the projection system. The reservoir is formed by a seal member 12 positioned below and surrounding the final element of the projection system PL. Liquid 11 is brought into the space below the projection system and within the seal member 12. The seal member 12 extends a little above the final element of the projection system and the liquid level rises above the final element so that a buffer of liquid is provided. The seal member 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid 11 is confined in the reservoir by a gas seal 16 between the bottom of the seal member 12 and the surface of the substrate W. The gas seal is formed by a gas, e.g. air or synthetic air but preferably $N_2$ or another inert gas, provided under pressure via inlet 15 to the gap between seal member 12 and substrate and extracted via first outlet 14. The overpressure on the gas inlet 15, vacuum level on the first outlet 14 and geometry of the gap are arranged so that there is a high-velocity air flow inwards that confines the liquid.

In the arrangement according to FIG. 5, an air bearing is formed in operation by the gas seal 16, the air bearing guiding the seal member 12 with respect to the substrate W. In this document, the term air bearing does not necessarily imply the application of air, instead, as described above, other gasses or gas mixtures can be used. The air bearing enables movement of the reservoir 10 as shown in FIG. 5 with respect to the substrate W. Thus, by displacing the reservoir 10 with respect to the substrate W, a different portion of the substrate is brought into contact with the liquid 11 and is positioned below the projection lens PL for illumination of that portion of the substrate W.

In immersion lithography, the immersion liquid may leak from the reservoir. Leakage of immersion liquid may lead to a variety of undesired effects. As an example, leakage of the immersion liquid onto the wafer may result in staining or contamination thereof. In lithography, throughput of a lithographic apparatus tends to increase, which, among other factors, tends to increase scanning speeds and hence an increase of corresponding stage accelerations. As a result of such higher accelerations, the risk of leakage of immersion liquid tends to increase.

In European Patent Application No. 03257072.3 the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

SUMMARY

It is desirable to minimize or even prevent leakage or spillage of immersion liquid during operation.

According to an embodiment of the invention, there is provided a lithographic apparatus that includes an illumination system configured to condition a radiation beam, and a support configured to support a patterning device. The patterning device is capable of imparting the radiation beam with a pattern in its cross-section to form a patterned radiation beam. The apparatus also includes a substrate table configured to hold a substrate, a projection system configured to project the patterned radiation beam onto a target portion of the substrate, and a liquid supply system configured to supply an immersion liquid between a downstream optical element of the projection system and the substrate. The apparatus further includes a control system configured to drive the substrate table so as to perform an acceleration profile to accelerate the substrate table from a first velocity in a first direction to a second velocity in a second direction. The acceleration profile is asymmetric in time and being dimensioned so that when the substrate table is accelerated according to the acceleration profile, a force to break a meniscus of the immersion liquid remains lower than a force to maintain the meniscus of the immersion liquid.

According to an embodiment of the invention, there is provided a lithographic projection method that includes projecting a pattern from a patterning device onto a target portion of a substrate with a projection system, supplying an immersion liquid between a downstream optical element of the projection system and the target portion of the substrate, accelerating the substrate according to an acceleration profile from a first velocity in a first direction to a second velocity in a second direction, and repeating the projecting for a following target portion of the substrate. The acceleration profile is asymmetric in time and is dimensioned so that when the substrate table is accelerated according to the acceleration profile, a force to break a meniscus of the immersion liquid remains lower than a force to maintain the meniscus of the immersion liquid.

According to an embodiment of the invention, there is provided a device manufacturing method that includes projecting a pattern from a patterning device onto a target portion of a substrate a projection system, supplying an immersion liquid between a downstream optical element of the projection system and the target portion of the substrate, accelerating the substrate according to an acceleration profile from a first velocity in a first direction to a second velocity in a second direction, and repeating the projecting for a following target portion of the substrate. The method also includes developing the irradiated substrate, and manufacturing a device from the developed substrate. The acceleration profile is asymmetric in time and is dimensioned so that when the substrate table is accelerated according to the acceleration profile, a force to break a meniscus of the immersion liquid remains lower than a force to maintain the meniscus of the immersion liquid.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
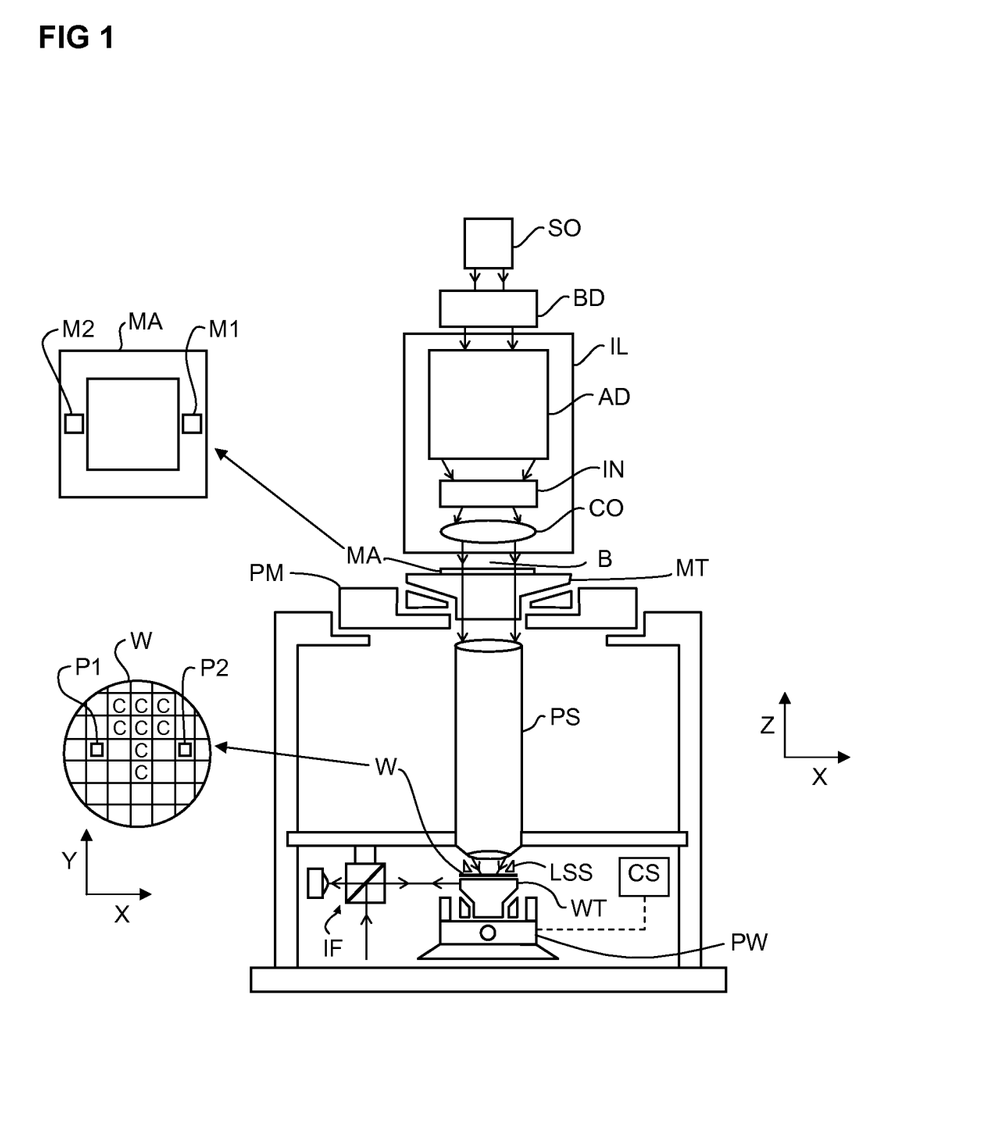
FIG. 1 depicts a lithographic apparatus in which an embodiment of the invention may be provided.

FIG. 1 schematically depicts a lithographic apparatus according to one embodiment of the invention. The apparatus Includes an illumination system (illuminator) IL configured to condition a radiation beam B (e.g. IV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in die scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In immersion lithography, many solutions may be applied to substantially reduce and even prevent leakage of the immersion liquid, such as usage of an air knife, (vacuum) suction of immersion liquid leakage, keeping a gap between the substrate surface and a liquid supply system LSS (see FIG. 1) as narrow as possible, etc. Nevertheless, the higher the accelerations of the stage, and consequently of the surface of the substrate relative to the liquid supply system LSS, the higher the risk of leakage of the immersion liquid.

In immersion applications, a loss of immersion liquid by the meniscus is determined by a force equilibrium of forces acting on a meniscus of the immersion liquid, e.g. in the gap between the liquid supply system and the surface of the substrate:

Capillary pressure+Airdrag=Flow viscosity+Flow inertia+Immersion liquid column inertia, which, in a more detailed mathematical formula, may be expressed as:

$$f_1 \cdot \frac{\gamma_{liquid}}{h} \cdot \cos(\theta_{rec}) + f_2 \cdot \frac{\partial V_{gas}}{\partial h} \cdot \eta_{gas} = \qquad (1)$$
$$f_3 \cdot \frac{V_{scan}}{h} \cdot \eta_{liquid} + f_4 \cdot \rho_{liquid} \cdot V_{scan}^2 + f_5 \cdot \rho_{liquid} \cdot a \cdot L$$

wherein:

$f_1 \ldots f_5$ are dimensionless constants depending on liquid supply system design;

$\gamma_{liquid}$, $\rho_{liquid}$, $\eta_{liquid}$ represent immersion liquid (e.g. water) surface tension, density and viscosity, respectively;

$\eta_{gas}$, $V_{gas}$ represent viscosity and speed of airdrag gas (e.g. air or $N_2$), respectively;

$\theta_{rec}$ is the receding contact angle of immersion liquid and surface;

a, $V_{scan}$ are the wafer stage acceleration and scan speed, respectively;

h is die distance between bottom of liquid supply system and substrate; and

L is the length of immersion liquid column (damper length).

The capillary pressure may be understood as the capillary forces of the meniscus. The airdrag may be understood as a drag of a gas flowing along the meniscus, the gas flow being provided by e.g. a gas suction system to remove a possible leakage of gas. The remaining three forces relate to a flow of the immersion liquid which occurs when the liquid supply system and the substrate move with respect to each other. Flow viscosity may be understood as a force required to change a direction of the flow of the immersion liquid along the surface of the substrate, which flow has to turn in direction upon reaching the meniscus. Flow inertia may be understood as an inertia by a kinetic energy in the flow of the immersion liquid along the surface of the substrate. Immersion liquid column inertia may be understood as a force required to bring the immersion liquid into a flow.

The left hand side of the above mathematical formula (1) expresses a sum of forces that keep the meniscus together, while the right hand side of the formula expresses a sum of forces that tend to disrupt the meniscus. The forces indicated at the left hand side of the formula therefore tend to avoid leakage of the immersion liquid, while the forces indicated at the right hand side of the formula tend to disrupt the meniscus, which may result in a risk of leakage of the immersion liquid. Leakage of the immersion liquid may be prevented by ensuring that, in operation of the lithographic apparatus, the sum of forces at the left side is kept equal to or larger than the sum of forces at the right side of the above formula.

Figure 6A:
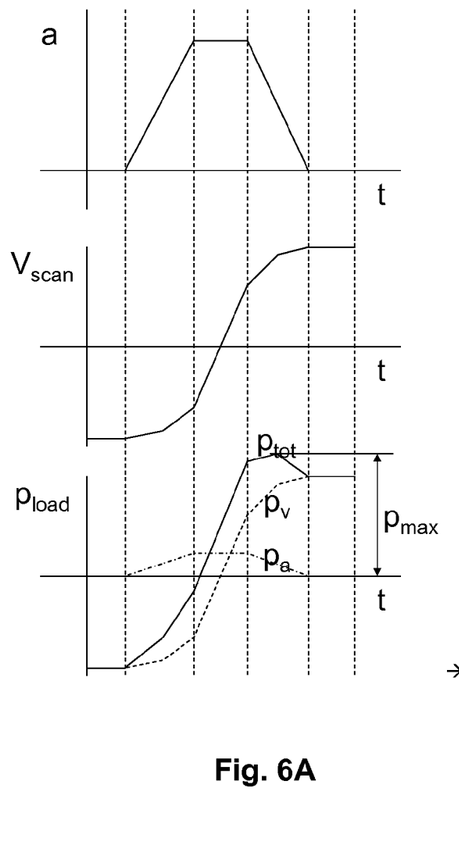
FIGS. 6A and 6B each depict a graphical view of substrate table acceleration, substrate table velocity and immersion liquid meniscus pressure versus time according to the state of the art and according to an embodiment of the invention.
Figure 6B:
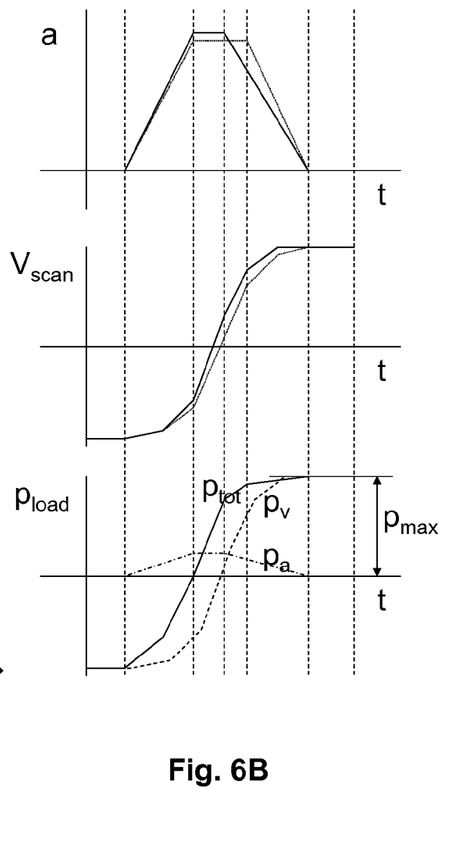

A problem may now occur during acceleration of the stage, which results in an acceleration of the surface of the substrate held by the substrate table, with respect to the liquid supply system. This will now be illustrated with respect to FIGS. 6A and 6B. FIGS. 6A and 6B illustrate an acceleration profile for accelerating the stage (and hence the surface of the substrate). As the liquid supply system is relatively stationary, the acceleration profile may also be considered an acceleration profile of the substrate surface relative to the liquid supply system.

As can be seen in the upper diagram of FIG. 6A, depicting acceleration versus time, a time symmetric acceleration profile is provided. A resulting scanning speed velocity profile versus time is depicted in the second diagram. In the third diagram, corresponding immersion liquid pressures are depicted, as determined according to the above formulas. As can be seen in the above formula, the flow viscosity depends on the scanning speed, the flow inertia is dependent on a square of the scanning speed while the immersion liquid column inertia is dependent on the acceleration. The third graph in FIG. 6A depicts a total pressure $p_{tot}$ on the meniscus (i.e. the sum of the 3 terms on the right side of the formula) and the contributions of the velocity dependent flow viscosity and flow inertia, indicated in FIG. 6A as p, and the contribution of the acceleration dependent water column inertia indicated in FIG. 6A by $p_a$. A maximum pressure is indicated in FIG. 6A by $p_{max}$. Any exceeding, by the maximum pressure (i.e. the right hand side of the formula), of the forces that maintain the meniscus (i.e. the left hand side of the formula), would result in a breakdown of the meniscus as the right hand term in the formula would then exceed the left hand term. As long as the total pressure by the right hand side terms remains lower than the maximum pressure, breaking of the meniscus due to the forces at the right hand side of the formula, should be prevented. As such, acceleration and velocity should be limited to avoid leakage of the immersion liquid.

According to an embodiment of the invention, a time asymmetric acceleration profile is provided, as depicted in FIG. 6B. Here, a phase wherein the acceleration decreases (lowers in absolute value) is substantially longer than a phase wherein the acceleration increases (in absolute value). A maximum of the acceleration related pressure contribution is located at a point in time where the velocity related pressure is still low, as the velocity is low at that point in time. In other words, the decrease in acceleration is commenced at the moment in time where the velocity is still low, which causes a maximum of the sum of the acceleration dependent and velocity dependent pressure contributions to remain comparatively lower. As a result, the total pressure during the acceleration profile remains lower than or at maximum substantially equal to a total pressure at constant scanning speed, i.e. when the acceleration is substantially zero, so that a risk of disruption of the meniscus during speed changes of the substrate table, may be substantially decreased, or even prevented. The scanning motion of the substrate table may be controlled by a control system CS (see FIG. 1) so as to move according to the acceleration profile. The above thereby provides an example of an asymmetric acceleration profile which provides for an acceleration of the substrate table from a first velocity in a first direction to a second velocity in a second direction, the acceleration profile being asymmetric in time and being dimensioned so that when the substrate table is accelerated according to the acceleration profile, a force to break a meniscus of the immersion liquid remains lower than a force to maintain the meniscus of the immersion liquid. Depending on the dimensioning of the particular situation, the rate of increase of the acceleration may in various embodiments exceed the rate of decrease in an absolute sense by at least 10%, at least 25%, substantially 30% or any suitable value. Also, it is noted that in the embodiment presented in FIG. 6B, duration of the time between the acceleration increase phase and the acceleration decrease phase may be kept smaller than the time length of each of the acceleration increase and acceleration decrease phases. Furthermore, although the acceleration profiles in the examples in FIGS. 6A and 6B have a same total time duration, this need not necessarily be the case. The longer duration of the phase with decreasing acceleration may for example result in a longer total time duration.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
 a support configured to support a patterning device, the patterning device being capable of imparting a radiation beam with a pattern in its cross-section to form a patterned radiation beam;
 a substrate table configured to hold a substrate;
 a projection system configured to project the patterned radiation beam onto a target portion of the substrate;
 a liquid supply system configured to supply an immersion liquid between a downstream optical element of the projection system and the substrate; and
 a control system configured to drive the substrate table so as to perform an acceleration profile to accelerate the substrate table from a first velocity in a first direction to a second velocity in a second direction that is different from the first direction, the acceleration profile being asymmetric in time and being dimensioned so that when the substrate table is accelerated according to the acceleration profile, a force to break a meniscus of the immersion liquid remains lower than a force to maintain the meniscus of the immersion liquid,
 wherein the acceleration profile comprises a first phase in which the acceleration increases in absolute sense with a rate of increase, a second phase in which the acceleration decreases in absolute sense with a rate of decrease and a third phase between the first phase and the second phase, the acceleration in the third phase being substantially constant, a time length of the third phase being smaller than the time length of each of the first and second phases.

2. The lithographic apparatus according to claim 1, wherein the force to maintain the meniscus of the immersion liquid comprises a sum of a capillary pressure and an airdrag pressure of the meniscus of the immersion liquid, and wherein the force to break the meniscus of the immersion liquid comprises a sum of a flow viscosity pressure, a flow inertia pressure and a water column inertia pressure of the meniscus of the immersion liquid in the liquid supply system.

3. The lithographic apparatus according to claim 1, wherein the rate of increase exceeds the rate of decrease by at least 10%.

4. The lithographic apparatus according to claim 3, wherein the rate of increase exceeds the rate of decrease by at least 25%.

5. The lithographic apparatus according to claim 3, wherein the rate of increase exceeds the rate of decrease by substantially 30%.

6. The lithographic apparatus according to claim 1, wherein the control system is configured to drive the substrate table so that the second phase begins at a point in time where an absolute value of a velocity of the substrate table is less than half of an absolute value of a maximum velocity of the substrate table during scanning operation.

7. A lithographic projection method comprising
projecting a pattern from a patterning device onto a target portion of a substrate with a projection system;
supplying an immersion liquid between a downstream optical element of the projection system and the target portion of the substrate;
accelerating the substrate according to an acceleration profile from a first velocity in a first direction to a second velocity in a second direction that is different from the first direction; and
repeating the projecting for a following target portion of the substrate,
wherein the acceleration profile is asymmetric in time and is dimensioned so that when the substrate table is accelerated according to the acceleration profile, a force to break a meniscus of the immersion liquid remains lower than a force to maintain the meniscus of the immersion liquid,
wherein the acceleration profile comprises a first phase in which the acceleration increases in absolute sense with a rate of increase, a second phase in which the acceleration decreases in absolute sense with a rate of decrease and a third phase between the first phase and the second phase, the acceleration in the third phase being substantially constant, a time length of the third phase being smaller than the time length of each of the first and second phases.

8. The lithographic projection method according to claim 7, wherein the force to maintain the meniscus of the immersion liquid comprises a sum of a capillary pressure and an airdrag pressure of the meniscus of the immersion liquid, and wherein the force to break the meniscus of the immersion liquid comprises a sum of a flow viscosity pressure, a flow inertia pressure and a water column inertia pressure of the meniscus of the immersion liquid in the liquid supply system.

9. The lithographic projection method according to claim 7, wherein the rate of increase exceeds the rate of decrease by at least 10%.

10. The lithographic projection method according to claim 9, wherein the rate of increase exceeds the rate of decrease by at least 25%.

11. The lithographic projection method according to claim 9, wherein the rate of increase exceeds the rate of decrease by substantially 30%.

12. The lithographic projection method according to claim 7, wherein the second phase begins at a point in time where an absolute value of a velocity of the substrate table is less than half of an absolute value of a maximum velocity of the substrate table during scanning operation.

13. A device manufacturing method comprising:
projecting a pattern from a patterning device onto a target portion of a substrate a projection system;
supplying an immersion liquid between a downstream optical element of the projection system and the target portion of the substrate;
accelerating the substrate according to an acceleration profile from a first velocity in a first direction to a second velocity in a second direction that is different from the first direction;
repeating the projecting for a following target portion of the substrate;
developing the irradiated substrate; and
manufacturing a device from the developed substrate,
wherein the acceleration profile is asymmetric in time and is dimensioned so that when the substrate table is accelerated according to the acceleration profile, a force to break a meniscus of the immersion liquid remains lower than a force to maintain the meniscus of the immersion liquid,
wherein the acceleration profile comprises a first phase in which the acceleration increases in absolute sense with a rate of increase, a second phase in which the acceleration decreases in absolute sense with a rate of decrease and a third phase between the first phase and the second phase, the acceleration in the third phase being substantially constant, a time length of the third phase being smaller than the time length of each of the first and second phases.

14. The device manufacturing method according to claim 13, wherein the force to maintain the meniscus of the immersion liquid comprises a sum of a capillary pressure and an airdrag pressure of the meniscus of the immersion liquid, and wherein the force to break the meniscus of the immersion liquid comprises a sum of a flow viscosity pressure, a flow inertia pressure and a water column inertia pressure of the meniscus of the immersion liquid in the liquid supply system.

15. The device manufacturing method according to claim 13, wherein the rate of increase exceeds the rate of decrease by at least 10%.

16. The device manufacturing method according to claim 15, wherein the rate of increase exceeds the rate of decrease by at least 25%.

17. The device manufacturing method according to claim 15, wherein the rate of increase exceeds the rate of decrease by substantially 30%.

18. The lithographic projection method according to claim 13, wherein the second phase begins at a point in time where an absolute value of a velocity of the substrate table is less than half of an absolute value of a maximum velocity of the substrate table during scanning operation.

19. A lithographic apparatus comprising:
a support configured to support a patterning device, the patterning device being capable of imparting a radiation beam with a pattern in its cross-section to form a patterned radiation beam;
a substrate table configured to hold a substrate;
a projection system configured to project the patterned radiation beam onto a target portion of the substrate;
a liquid supply system configured to supply an immersion liquid between a downstream optical element of the projection system and the substrate; and
a control system configured to drive the substrate table so as to perform an acceleration profile to accelerate the substrate table, the acceleration profile being asymmetric in time and being dimensioned so that when the substrate table is accelerated according to the acceleration profile, a force to break a meniscus of the immersion liquid remains lower than a force to maintain the meniscus of the immersion liquid, wherein the acceleration profile comprises a first phase in which the acceleration increases in absolute sense with a rate of increase, a second phase in which the acceleration decreases in absolute sense with a rate of decrease and a third phase between the first phase and the second phase, the acceleration in the third phase being substantially constant, and wherein the second phase begins at a point in time where an absolute value of a velocity of the substrate table is less than half of an absolute value of a maximum velocity of the substrate table during scanning operation.

20. The lithographic apparatus according to claim 19, wherein a time length of the third phase is smaller than the time length of each of the first and second phases.

* * * * *